United States Patent [19]

Inoue et al.

[11] Patent Number: 5,165,343
[45] Date of Patent: Nov. 24, 1992

[54] PRINTING PLATE AND PRINTING PROCESS

[75] Inventors: Eiichi Inoue; Mitsuru Takeda; Hitoshi Fujii; Minoru Utsumi; Noritaka Egashira; Satoru Kuramochi, all of Tokyo, Japan

[73] Assignee: Dai Nippon Insatsu Kabushiki Kaisha, Japan

[21] Appl. No.: 606,731

[22] Filed: Oct. 31, 1990

[51] Int. Cl.⁵ .......................... B41N 1/00; B41N 3/00
[52] U.S. Cl. .................................. 101/395; 101/453; 101/463.1; 428/195; 428/220
[58] Field of Search ........................ 101/395, 453–457, 101/463.1; 428/195, 220

[56] References Cited

U.S. PATENT DOCUMENTS

| | | | |
|---|---|---|---|
| 3,990,897 | 11/1976 | Zuerger et al. | 101/395 |
| 4,097,647 | 6/1978 | Shaw | 101/460 |
| 4,147,549 | 4/1979 | Held | 101/453 |
| 4,297,436 | 10/1981 | Kubotera et al. | 101/454 |
| 4,298,680 | 11/1981 | Bruno | 101/456 |
| 4,430,379 | 2/1984 | Hayakawa et al. | 101/457 |
| 4,943,467 | 7/1990 | Shuji | 101/395 |

Primary Examiner—Edgar S. Burr
Assistant Examiner—Lynn D. Hendrickson
Attorney, Agent, or Firm—Parkhurst, Wendel & Rossi

[57] ABSTRACT

A printing plate including a printing plate member, an easily deformable elastic layer laminated on the printing plate member, a surface layer having a higher elasticity than that of the elastic layer, laminated on the elastic layer, and a printing surface layer formed on the surface layer. The printing surface layer has an image area having an affinity with an ink and a non-image area having an ink repellancy.

5 Claims, 4 Drawing Sheets

PRINTING PLATE AND PRINTING PROCESS

BACKGROUND OF THE INVENTION

The present invention relates to a printing plate and a printing process.

Various printing processes have been heretofore adopted. As typical instances, there can be mentioned offset printing, typography and gravure printing. According to the offset printing process, a planographic printing plate is used, an ink is supplied to the plate through many ink transfer rollers and a material to be printed is directly printed. According to the gravure printing process, an intaglio printing plate is used and a material to be printed is directly printed without using ink transfer rollers.

However, each of the above-mentioned printing processes has defects. More specifically, in the gravure printing process, since a material to be printed is directly printed without using ink transfer rollers, the structure of the printing machine is simple, but since an intaglio plate is used, a recess should ordinarily be formed according to the etching process and the plate-making process is complicated.

In the offset printing process, a planographic plate having no substantial convexity or concavity is used, and therefore, the plate-making process is simple and the plate can be easily attached to a plate cylinder. However, since a blanket plate cylinder has to be used and many ink transfer rollers have to be used, the structure of the printing mechanism is complicated. Although direct printing can be done by contacting a printing sheet directly with a planographic plate, the print quality is bad, and the process is fatally defective in that when a coarse surface printing sheet is used, the print quality is drastically degraded.

In the typography, since many ink transfer rollers have to be used, the structure of the printing machine is complicated and since a typographic printing plate has to be used, a convex part should be formed on the printing plate, the plate-making operation becomes complicated. Moreover, in the typography, since the contact area of a printing sheet to the plate differs according to the image density, and hence, pressure unevenness is readily caused, and a troublesome make ready operation should be carried out when the plate is attached to the cylinder.

The present invention has been completed to solve the foregoing problems involved in the conventional techniques, and it is therefore a primary object of the present invention to provide a printing plate and a printing process, in which the plate-making operation is easily accomplished, the structure of a printing machine is simplified and good printing can be performed even on a coarse surface printing sheet.

SUMMARY OF THE INVENTION

We made investigations with a view to simplifying the structure of a printing machine by using a printing plate that can be easily made, performing direct printing without using a blanket cylinder and supplying an ink by a small number of ink transfer rollers. As a result, it was found that if a plurality of layers differing in the modulus of elasticity are formed on the surface of a printing plate, good printing can be done on various printing sheets differing in the surface characteristics (including from coarse surface printing sheets to plastic films), and printing can be performed by utilizing the difference between the affinity of an ink with an image area and the affinity of the ink with a non-image area. We have now completed the present invention based on this finding.

More specifically, in accordance with the present invention, there are provided a printing plate comprising a printing plate member, an easily deformable elastic layer laminated on the printing plate member, a surface layer having a higher modulus of elasticity (higher hardness) than that of the elastic layer, laminated on the elastic layer, and a printing surface layer formed on the surface layer, said printing surface layer having an image area having an affinity with an ink and a non image area having an ink repellancy, and a printing process in which a material to be printed is directly printed by using this printing plate.

The printing plate of the present invention is, in principle, a planographic printing plate, and an image area having an affinity with an ink and a non-image area having an ink repellancy are formed on the surface of the printing plate. Accordingly, large convexities or concavities need not be formed on the image area or non-image area and the plate-making process can be performed easily. Moreover, since the surface structure of the plate consists of a laminate comprising an elastic layer and a surface layer having an elastic modulus different from that of the elastic layer, the surface of the plate per se has an appropriate and specific softness, and when printing is carried out by contacting a printing sheet directly with the printing plate surface, if the printing sheet is pressed on the plate surface by an impression cylinder or the like, because of the specific softness of the plate surface per se, the plate surface is deformed according to convexities and concavities of the printing sheet and the image area is tightly contacted with the printing sheet. Accordingly, a high-quality print can be obtained by direct printing even on a coarse surface printing sheet, on which formation of a good print is relatively difficult according to the conventional techniques. Moreover, since the surface layer having a high modulus of elasticity (high hardness) is superposed on the outer side, thickening of image lines and reduction of the sharpness of the image, which are readily caused when a printing layer is disposed directly on the elastic layer, can be effectively prevented, and therefore, a high-quality printing can be obtained.

Still further, since printing is performed by utilizing the difference of the affinity with an ink, a damping roller, which is ordinarily necessary for the planographic printing, need not be used. Furthermore, if an ink having a low viscosity is used, the number of ink transfer rollers can be reduced, for example, to 0 to 4, and the structure of an ink supply mechanism in the printing machine can be simplified.

DETAILED DESCRIPTION OF THE INVENTION

The present invention will now be described in detail with reference to the accompanying drawings.

Figure 1:
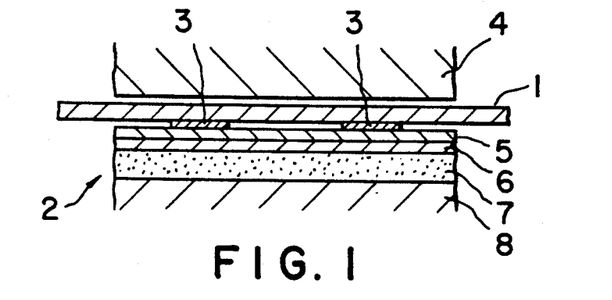
FIG. 1 is a sectional view illustrating the printing principle of the present invention.

FIG. 1 illustrates the principle of the present invention, and in FIG. 1, reference numeral 1 represents a printing sheet, reference numeral 2 represents a printing plate and reference numeral 4 represents pressing means for pressing the printing sheet 1 to the printing plate, for example, a plate cylinder. In principle, as shown in FIG. 1, the printing plate 2 of the present invention comprises a plating surface layer (described in detail hereinafter) 5 having an image area having an affinity with an ink and an ink-repellant non-image area, a surface layer 6 having the printing surface layer 5 laminated thereon, an elastic layer 7 supporting the surface layer 6 and a printing plate member 8 supporting the elastic layer 7.

The elastic layer 7 is disposed to support the printing surface layer 5 through the surface layer 6 and to allow deformation of the printing surface layer 5 according to convexities and concavities of a printing sheet, and the surface layer 6 is disposed to prevent thickening of image lines and reduction of the sharpness of image lines by excessive deformation of the elastic layer. Preferably, the surface layer is formed of a material having a rubber hardness of 50 to 90 (based on the value measured by a spring type hardness tester specified in JIS K-6301). More specifically, there can be used thermosetting resins such as an epoxy resin, a highly elastic urethane resin, a polyester resin, a melamine resin and a phenolic resin. The thickness of the surface layer 6 is generally 1 to 100 μm and preferably about 5 to about 50 μm. The surface layer 6 can also act as the image area or non-image area of the printing surface layer 5. The elastic layer 7 is preferably formed of a material having a rubber hardness of about 10 to about 50. More specifically, there can be mentioned rubbers such as a chloroprene rubber, a nitrile rubber, a polybutadiene rubber, a urethane rubber, a styrene/butadiene rubber and an SBS rubber. The thickness of the elastic layer 7 is determined according to the hardness of the elastic layer per se and the easy deformability required for the printing surface, but the thickness of the elastic layer 7 is ordinarily about 0.05 to about 10 mm and preferably about 0.1 to about 1 mm. The printing plate member 8 is disposed to support the elastic layer 7 and the printing plate member 8 can be either a plate cylinder or a substrate different from the plate cylinder.

Figure 13:
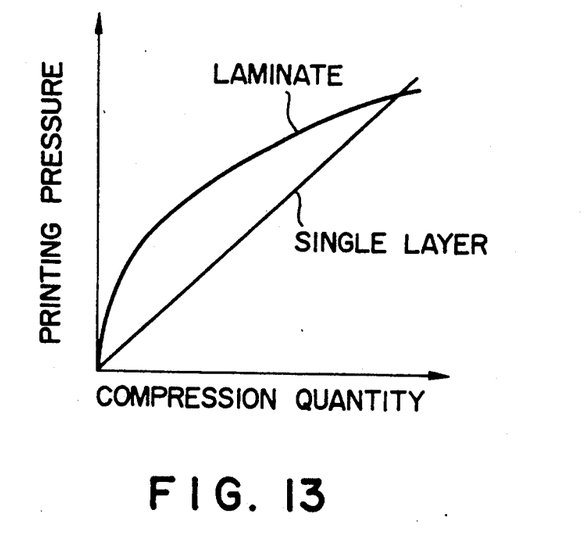
FIGS. 13 and 14 are graphs illustrating the relation between the compression quantity and the printing pressure.
Figure 14:
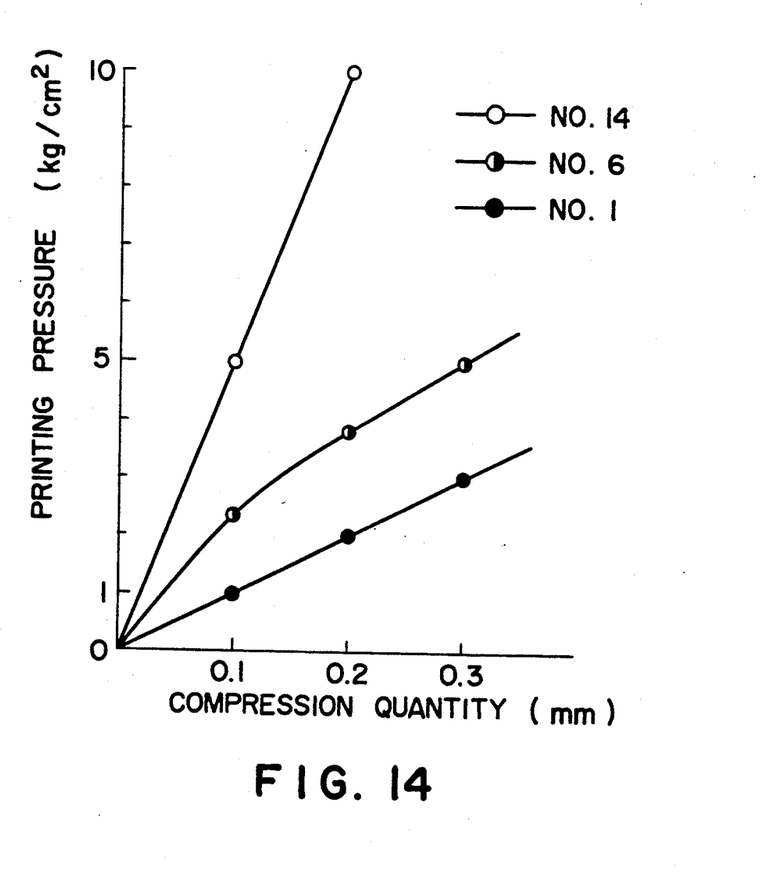

The effect attained by the above-mentioned lamination of the elastic layer and surface layer will now be described with reference to the relation between the compression quantity and printing pressure. In general, the printing pressure applied at the printing operation is determined by the hardness, thickness and compression quantity of the plate, but we found that in the case where the structure of the printing plate consists of a laminate of an elastic layer and a surface layer, a peculiar relation is established between the compression quantity and the printing pressure. More specifically, in the case where the surface of the printing plate comprises a single layer (for example, an elastic layer alone), as shown in FIG. 13, a linear relation is established between the compression quantity and the printing pressure. In contrast, in the case where, as in the present invention, layers differing in the modulus of the elasticity are laminated and the rubber hardness of the surface layer is higher, as shown in the drawings, the printing pressure is higher in a region where the compression quantity is relatively small. Accordingly, even if the compression quantity is changed owing to the thickness unevenness or convexities and concavities of a printing sheet, the change of the printing pressure is small and stable ink transfer can be realized.

In the case where the surface of the printing plate consists of a single layer, a bulge is readily formed before and after the printing nip, which causes doubling. In general, at the printing plate, a difference of the peripheral speed is unavoidably produced between the surface of the plate cylinder and a material to be printed (impression cylinder). Accordingly, shear of image lines is caused in the printing direction, which results in occurrence of slur. According to the present invention, since the surface of the printing plate has the above-mentioned laminate structure, the surface layer having a high modulus elasticity controls deformation of the printing surface and an excellent effect of sharpening image lines can be attained. In order to attain the above-mentioned effect by the lamination, it is preferred that the difference of the rubber hardness between the elastic layer and the surface layer be at least 10.

In the present invention, the thickness of the elastic layer can be appropriately selected according to the kind of the material to be printed and the viscosity of the ink, but it is preferred that the thickness of the elastic layer be selected so that supposing that the compression quantity of the printing plate at the printing is 0.1 mm, the printing pressure is in the range of from 0.5 to 20 kgf/cm$^2$. From general properties of the elastic material, as the elastic layer is thick, the printing pressure to a certain compression quantity tends to drop, and if the printing pressure is too low, the collapse of the solid portion becomes insufficient. In contrast, if the elastic layer is too thin, although the printing pressure increases, the property of following up the surface condition of the material to be printed is degraded and good results cannot be obtained.

At the printing step using the printing plate 2, when the ink is applied to the printing surface, the ink 3 adheres only to the image area having an affinity with the ink, and then, the ink is applied to a printing sheet 1 pressed directly to the printing surface to effect printing. Since the printing surface layer 5 falling in contact with the printing sheet 1 and the elastic layer 7 supporting the printing surface layer 5 are easily deformable, they adhere tightly to the printing sheet 1 by deformation of these layers and a good print can be obtained.

Figure 2:
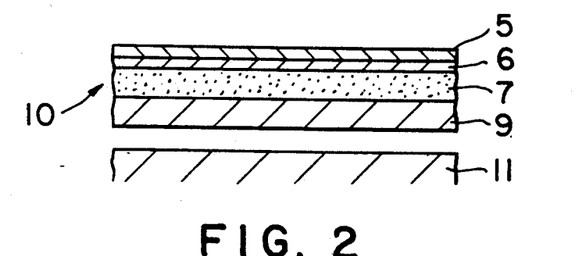
FIGS. 2 through 4 are sectional views illustrating examples of the structure of the printing plate.
Figure 3:
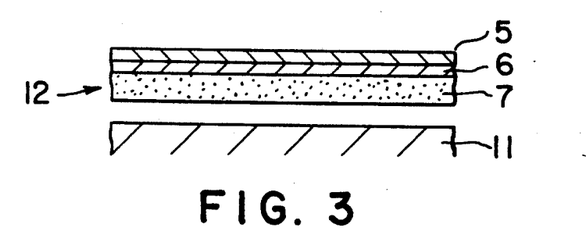
Figure 4:
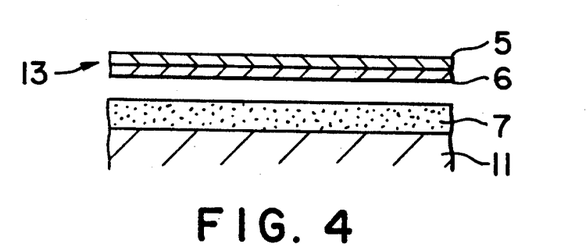

The printing surface layer 5, surface layer 6, elastic layer 7 and printing plate member 8 constituting the printing plate 2 are in the laminated state as shown in the drawings at the printing step. It is not absolutely indispensable that this laminate structure shown in the drawings should be maintained at the plate-making step, but various forms can be adopted. For example, FIG. 2 shows an example in which the printing surface layer 5, surface layer 6 and elastic layer 7 are bonded to a substrate 9 to form an integrated plate 10, a predetermined image area is formed on the printing surface layer 5 of this plate 10 and the plate 10 is attached to a plate cylinder proper 11 to form a printing plate 2 as shown in FIG. 1. In this example, the substrate 9 and plate cylinder proper 11 act as the printing plate proper 8 shown in FIG. 1. As the substrate 9 in this example, there can be used a thin sheet of a metal such as aluminum or copper, a plastic film and a paper sheet. FIG. 3 illustrates an example in which an integrated plate 12 comprising the printing surface layer 5, surface layer 6 and elastic layer 7 is made, a predetermined image area is formed on the printing surface layer 5 of this plate 12 and the plate 12 is attached to a plate cylinder proper 11 to form a printing plate 2 as shown in FIG. 2. In this example, the plate cylinder proper 11 acts as the printing plate member 8 shown in FIG. 1. FIG. 4 shows an example in which a plate 13 comprising only the printing surface layer 5 and surface layer 6 is made, a predetermined image area is formed on the printing surface layer 5 of this printing plate 13, the elastic layer 7 is separately formed on the peripheral surface of a plate cylinder proper 11 and the plate 13 is bonded on the elastic layer 7 to form a printing plate 2 as shown in FIG. 1. Also in this example, the plate cylinder proper 11 acts as the printing plate member 8 shown in FIG. 1.

The printing surface layer 5 will now be described in detail. The illustration will now be made with reference to the integrated plate comprising the printing surface layer 5, surface layer 6, elastic layer 7 and substrate 9, as shown in FIG. 2. However, the same can hold good with other surface printing layers 5 shown in FIGS. 3 and 4.

Figure 5A:
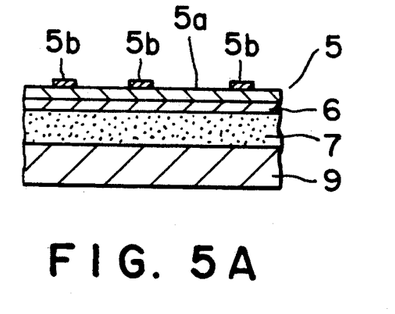
FIGS. 5A, 5B, 6A, 6B and 7 are sectional views showing examples of the printing surface layer of the printing plate.
Figure 5B:
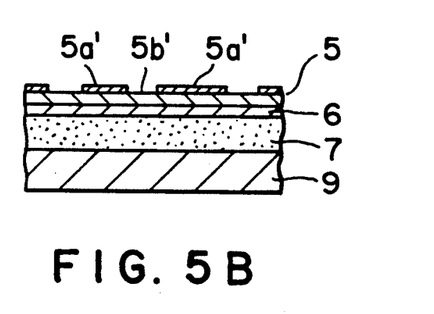

Examples of the printing plate for performing printing with an aqueous ink are shown in FIGS. 5A and 5B. FIG. 5A shows the plating surface layer 5 of the planographic letterpress type and FIG. 5B shows the printing surface layer 5 of the planographic intaglio type. The printing surface layer 5 shown in FIG. 5A comprises a hydrophobic resin layer 5a uniformly formed on the top surface of the surface layer 6 and a hydrophilic resin area 5b formed on the top surface of the hydrophobic resin layer 5a in correspondence to an image area. Since the hydrophilic resin area 5b is hydrophilic, the ink adheres to this area but the other area shows a repellancy to the ink and the ink does not adhere because the hydrophobic resin area 5a is exposed. Accordingly, the hydrophilic resin area 5b forms an image area while the other area forms a non-image area. Thus, the ink adheres selectively to the hydrophilic resin area 5b alone to form an image area, and therefore, the thickness of this hydrophilic resin area 5b can be greatly reduced. Ordinarily, the thickness of the hydrophilic resin area 5b forming an image area is adjusted to about 1 to about 50 μm. Since the hydrophobic resin layer 5a is supported by the surface layer 6 and elastic layer 7, a high strength is not particularly necessary and the rigidity is preferably such that the hydrophobic resin layer 5a is easily deformable according to the surface undulation of a printing sheet. Accordingly, the thickness of the hydrophobic layer 5a is preferably small and the thickness is ordinarily adjusted to about 1 to about 100 μm. Incidentally, the hydrophobic resin layer 5b can be reinforced by interposing an appropriate plastic film or the like below the hydrophobic resin layer 5a. The printing surface layer 5 shown in FIG. 5B a hydrophilic resin layer 5b' formed uniformly on the top face of the surface layer 6 and a hydrophobic resin area 5a' formed on the top face of the hydrophilic resin layer 5b' in correspondence to a non-image area. In this printing surface layer 5, a concave area surrounded by the hydrophobic resin area 5a' (an area where the hydrophilic resin layer 5b' is exposed) is an image area, and the hydrophobic resin area 5a' is a non-image area. Also in the printing surface layer 5 shown in FIG. 5B, the thickness of the upper hydrophobic resin area 5a' is adjusted to about 1 to about 50 μm, and the thickness of the lower hydrophilic resin layer 5b' is adjusted to about 1 to about 100 μm.

As the hydrophobic resin constituting the non-image area in the embodiments shown in FIGS. 5A and 5B, there can be mentioned silicone rubbers and resins such as dimethylorganopolysiloxane and phenylmethylorganopolysiloxane, fluorine-containing resins such as polytetrafluoroethylene, vinylidene fluoride and polytrifluorochloroethylene, and hydrocarbon resins such as styrene type resins, polyethylene, polypropylene and polymethylpentene. In the embodiment shown in FIG. 5A, when the hydrophobic resin has a high elasticity, the hydrophobic resin layer can also act as the surface layer 6.

As the hydrophilic resin, there can be mentioned vinyl resins such as polyvinyl alcohol, polymethyl vinyl ether and polyethyl vinyl ether, polyamide resins such as gelatin and casein, methylcellulose resins such as acetyl cellulose and cellulose propionate, and pyrrolidone resins such as polypyrrolidone. In the embodiment shown in FIG. 5B, when the hydrophilic resin has a high elasticity, the hydrophilic resin layer can also act as the surface layer 6.

Figure 6A:
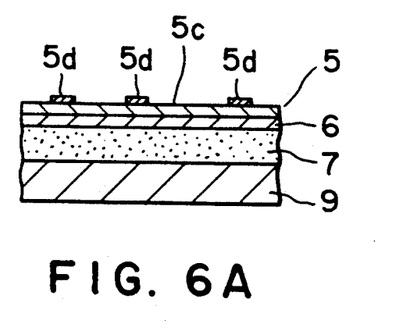
Figure 6B:
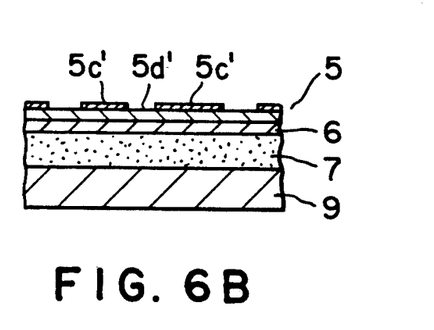

FIGS. 6A and 6B show embodiments of the printing plate for performing printing by using an oily ink. FIG. 6A shows the plating surface layer 5 of the planographic letterpress type and FIG. 6B shows the printing surface layer 5 of the planographic intaglio type. The printing surface layer 5 shown in FIG. 6A comprises an oil-repellant resin layer 5c formed uniformly on the top face of the surface layer 6 and an oleophilic resin area 5d formed on the top face of the oil-repellant resin layer 5c in correspondence to an image area. Since the oleophilic resin area 5d has an affinity with the oily ink, the ink adheres to this area, but since the oil-repellant resin layer 5c is exposed in the other area and the other area shows a repellancy to the ink, the ink does not adhere to the other area. Accordingly, the oleophilic resin area 5d is an image area, and the other area is a non-image area. In this embodiment, the thicknesses of the oleophilic resin area 5d and the oil-repellant resin layer 5c are the same as those of the hydrophilic resin area 5b and the hydrophobic resin layer 5a in the embodiment shown in FIG. 5A. The surface printing layer 5 shown in FIG. 6B comprises an oleophilic resin layer 5d' formed uniformly on the top face of the surface layer 6 and an oil-repellant resin area 5c' formed on the top face of the oleophilic resin layer 5d' in correspondence to a non-image area. In this printing surface layer 5, the concave area surrounded by the oil-repellant resin area 5c' (area in which the oleophilic resin layer 5d' is exposed) is an image area, and the oil-repellant resin area 5c' is a non-image area. In this embodiment, the thicknesses of the oil-repellant resin area 5c' and the oleophilic resin layer 5d' are the same as those of the hydrophobic resin area 5a' and the hydrophilic resin layer 5b' in the embodiment shown in FIG. 5B.

As the oil-repellant resin constituting the non-image are in the embodiments shown in FIGS. 6A and 6B, there can be mentioned silicone rubbers and resins such as dimethylorganosiloxane and phenylmethylorganopolysiloxane, and fluorine-containing resins such as polytetrafluoroethylene, polyvinylidene fluoride and polytrifluorochloroethylene. As the oleophilic resin, there can be mentioned various photoresists such as diazo type, azide type and cyclized rubber type photoresists, polyesters, acrylic resins, alkyd resins, epoxy resins, phenolic resins and polyurethane.

Figure 7:
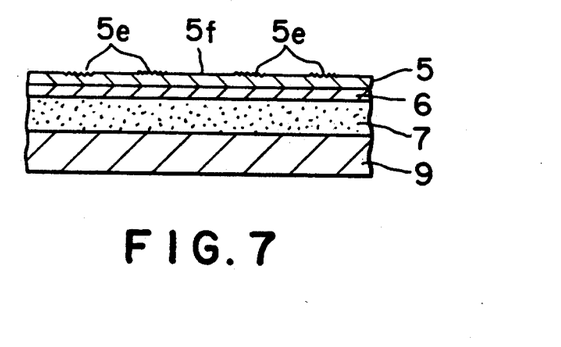

FIG. 7 shows still another embodiment of the printing surface layer 5. In this embodiment, an oleophilic image area 5e and an oil-repellant non-image area 5f are formed on the printing surface layer 5 composed of a single resin layer. This printing surface layer 5 can be formed by forming a uniform layer of an oil-repellant resin and rendering a part of the surface (image area) of this uniform layer oleophilic. For example, there can be adopted a method in which the top face of the surface layer 6 is uniformly coated with an oil-repellant resin having a foaming agent dispersed uniformly therein and a part (image area) of the coating is heated to effect foaming, whereby the surface is coarsened to impart oleophilic characteristics, and a method in which a part (image area) of the surface of the oil-repellant resin layer is coarsened by discharge breakdown.

The process for making printing plates as mentioned above will now be described. The printing surface layers 5 shown in FIGS. 5A, 5B, 6A and 6B can be made according to the ordinary photomechanical process. For example, the printing surface layer 5 of the planographic letterpress type shown in FIG. 5A or 6A can be made by a method in which the hydrophobic resin layer 5a or oil-repellant resin layer 5c is formed, the surface of the layer 5a or 5c is uniformly coated with a photosensitive resin containing a hydrophilic resin or oleophilic resin as the binder, the coated surface is exposed to light through a transparent original and then, development and fixation are carried out. The printing surface layer 5 of the planographic intaglio type shown in FIG. 5B or 6B can be made by a method in which the hydrophilic resin layer 5b' or oleophilic resin layer 5d' is formed, the surface of the layer 5b' or 5d' is uniformly coated with a photosensitive resin comprising a hydrophobic resin or oil-repellant resin as the binder the coated layer is exposed to light through a transparent original and then, development and fixation are carried out.

Furthermore, the plate can be directly made by utilizing the heat-sensitive transfer method, the electrophotographic method and the like. These methods will now be described.

When the printing surface layer 5 shown in FIG. 5B is made according to the heat-sensitive transfer method, at first, the hydrophilic resin layer 5b' is uniformly formed on the surface layer 6. Separately, a transfer layer of a hydrophobic resin, for example, a transfer film having a paraffin wax layer is prepared. By a heat-sensitive transfer recording apparatus having this transfer film set therein, the transfer film is piled on the hydrophilic resin layer 5b', and the position corresponding to non-image area is heated from the back by a thermal head according to an image information. By this heating, the hydrophobic resin transfer layer on the transfer film is melted and transferred onto the hydrophilic resin layer 5b' to form the hydrophobic resin area 5a' in the non-image area, whereby the printing surface layer 5 shown in FIG. 5B is formed.

When the printing surface layer 5 shown in FIG. 6A is made according to the heat-sensitive transfer method, at first, the oil-repellant resin layer 5c is uniformly formed on the surface layer 6. Separately, a transfer layer of an oleophilic resin, for example, a transfer film having a paraffin or urethane wax layer, is prepared. By a heat-sensitive transfer recording apparatus having this transfer film set therein, the transfer film is piled on the oil-repellant resin layer 5c, and the position corresponding to the image area is heated from the back by a thermal head according to an image information. By this heating, the oleophilic resin transfer layer of the transfer film is melted and transferred onto the oil-repellant resin layer 5c to form the oleophilic resin area 5d in the image area, whereby the printing surface layer 5 shown in FIG. 6A is formed.

When the printing surface layer layer 5 shown in FIG. 6A is formed by the electrophotographic process, the oil-repellant resin layer 5c is formed, and image recording is carried out on the oleophilic resin layer 5c by using a toner composed of an oleophilic resin according to the electrostatic photography, whereby the oleophilic resin area 5d is formed.

The printing surface layer 5 shown in FIG. 7 is formed by coating an oil-repellant resin having a foaming agent dispersed therein uniformly on the top face of the surface layer 6 and heating a part (image area) of the coated layer by a thermal head of a heat-sensitive recording apparatus according to an image information to effect foaming. Laser beams can be used for heating instead of the thermal head. According to another method, an oil-repellant resin layer is formed on the surface layer through an electroconductive layer and the image area is subjected to discharge breakdown to form an oleophilic image area.

A printing unit for use in carrying out the printing process of the present invention by using the printing plate having the above-mentioned structure will now be described.

Figure 8:
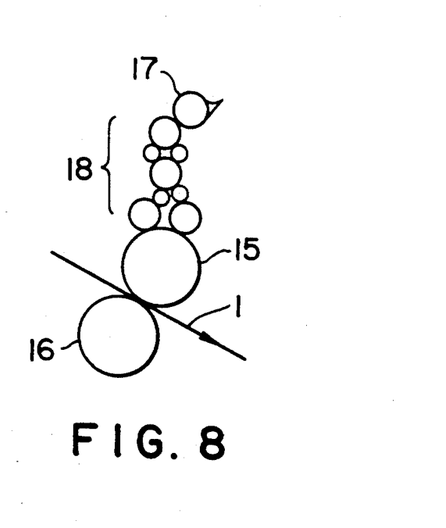
FIGS. 8 through 12 ar side views illustrating examples of the arrangement of rollers in the printing unit used in the process of the present invention.

FIG. 8 is a diagram illustrating the roll arrangement in the printing unit used for carrying out the present invention. In FIG. 8, reference numeral 1 represents a printing sheet, reference numeral 15 represents a plate cylinder provided with the printing plate 2 shown in FIG. 1, reference numeral 16 represents an impression cylinder for pressing the printing sheet 1 to the plate cylinder 15, reference numeral 17 represents an ink fountain roller, and reference numeral 18 represents ink distributing rollers. In this embodiment, an ink having a relatively high viscosity is used, and this ink is fed to the ink distributing rollers 18 from the ink fountain roller 17 and is kneaded by the rollers 18. Then, the ink is supplied to the plate cylinder 15 and is directly applied to the printing sheet 1 pressed by the impression cylinder 16 to effect printing.

Figure 9:
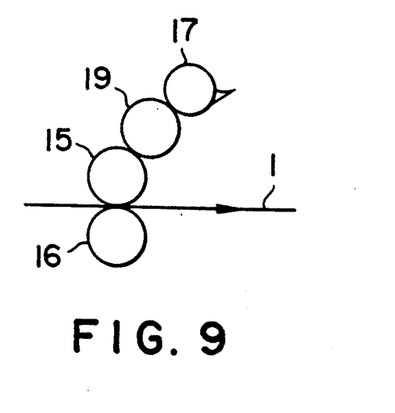

FIG. 9 illustrates another embodiment of the printing unit, where a single ink transfer roller 19 is used instead of the ink distributing rollers. In this embodiment, an ink having a relatively low viscosity is used.

Figure 10:
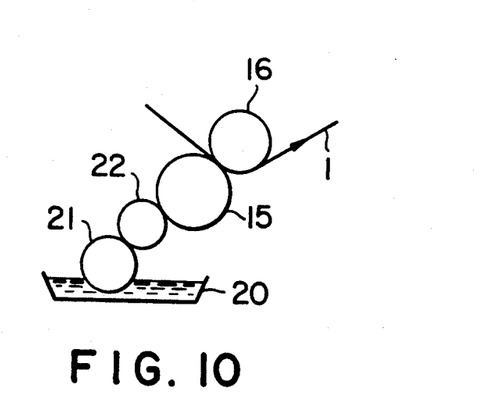

FIG. 10 illustrates still another embodiment of the printing unit, in which the plate cylinder 15 is located at a position lower than that of the impression cylinder 16 and the ink is supplied by an ink pump-up roller 21 rotated in an ink pan 20 and an ink transfer roller 22. Also in this embodiment, an ink having a relatively low viscosity is used.

Figure 11:
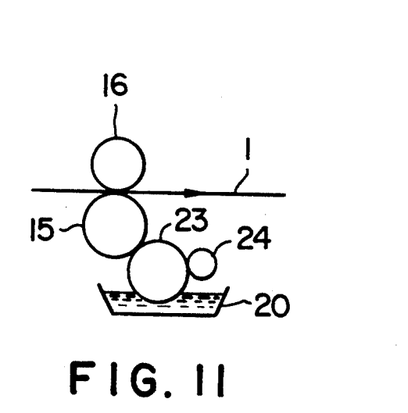

FIG. 11 shows a modification of the embodiment shown in FIG. 10, where an inking roller 23 and a doctor roller 24 are used instead of the ink pump-up roller and ink transfer roller shown in FIG. 10, and the ink is supplied to the plate cylinder 15 while regulating the ink adhering to the inking roller 23 by the doctor roller 24. Also in this modification, an ink having a relatively low viscosity is used.

Figure 12:
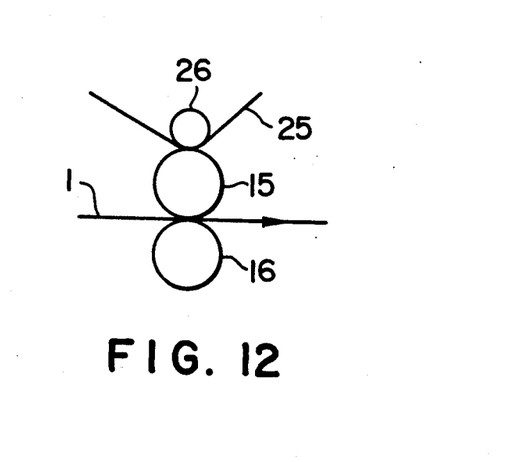

FIG. 12 illustrates still another embodiment of the printing unit where an ink transfer sheet 25 is pressed to a plate cylinder 15 by a nip roller 26 and an ink on the ink transfer sheet 25 is supplied to the plate cylinder 15. In order to attain good ink transfer, the nip roller 26 is heated.

In each of the foregoing printing units, the ink supplied to the plate cylinder 15 adheres only to the image area of the printing surface and is then applied to a printing sheet to effect printing. At this printing, since the printing surface is supported by the elastic layer 7 as shown in FIG. 1, when the printing surface is brought into contact with a printing sheet 1, the printing surface can be deformed according to undulations of the printing sheet, and good printing can be performed even on a printing sheet having a coarse surface.

As is apparent from the foregoing description, since the printing surface of the printing plate of the present invention has an image area having an affinity with an ink and an ink-repellant non-image area, large undulations need not be formed on the image area and non-image area, and therefore, the printing plate can be formed as a planographic plate and the plate-making operation is facilitated. Furthermore, since a printing surface layer provided with an image area and a non-image area is held on a laminate comprising a surface area having a high elasticity and a relatively soft elastic layer, the printing surface per se has an appropriate and peculiar softness, and when printing is performed by bringing a printing sheet into direct contact with this printing surface, if the printing sheet is pressed to the printing surface by an impression cylinder or the like, the printing surface is deformed according to undulations of the printing sheet because of the softness of the printing surface per se and the image area is tightly fitted to the printing sheet. Therefore, good printing can be accomplished by direct printing even on a course surface printing paper sheet, printing of which is ordinarily difficult. Moreover, at this printing, thickening of the image area and reduction of the sharpness can be prevented by the highly elastic surface layer, and a print having a high quality can be obtained. Still further, according to the present invention, since application of an ink to a printing ink is not effected by utilizing undulations of the printing surface, when the printing plate is attached to a plate cylinder per se, the make ready operation necessary for conventional typographic printing plates need not be performed, as is seen from the embodiments shown in FIGS. 2 through 4, and the plate-attaching operation can be facilitated.

Still further, since printing is performed by utilizing the difference of the affinity with an ink, a damping roller customarily used in the planographic printing need not be used, and therefore, the mechanism for supplying an ink to a plate cylinder can be simplified, as is seen from the embodiments illustrated in FIGS. 9 through 11. As is seen from the foregoing description, according to the present invention, there can be attained effects of obtaining a high-quality print by direct printing using a printing plate which can be easily made and simplifying the structure of a printing machine.

Production Examples

An NBR/PVC blend rubber (1 mm in thickness) having a JIA-A rubber hardness of 5 to 60 was bonded onto a polyethylene terephthalate sheet having a thickness of 188 μm to form a lowly elastic layer. Then, a silane coupling agent ("KBP-43" supplied by Shin-etsu Kagaku K.K., Japan) was coated as a primer in a thickness smaller than 1 μm. After drying, for formation of a highly elastic surface layer, a liquid photosensitive resin ("APR" supplied by Asahi Kasei K.K., Japan) was coated in a thickness of 40 μm and cured by irradiation with ultraviolet rays, so that the rubber hardness after curing was 40 to 98. Thus, various laminates were prepared.

A photopolymerizable silicone resin (disclosed in Japanese Patent Publication No. 51-17081) was coated in a thickness of 2 μm on each of the obtained laminate. A photographic original plate was contacted closely with the laminate and light exposure was carried out, followed by development. Thus, printing plates were obtained.

Inking of each printing plate was carried out with a dry planographic ink (disclosed in Japanese Patent Laid-Open Publication No. 56-6158) by using four rollers in a simple typographic printing machine and direct printing was effected on a paper sheet to obtain a print. The printing pressure was measured by a pressure sensor ("MRU-20K" supplied by Showa Sokki K.K., Japan) interposed between the plate cylinder and impression cylinder. The compression quantity was changed, and the relation between the printing pressure and compression quantity was examined. The obtained results are shown in Table 1.

TABLE 1

| Example No. | Rubber Hardness of Surface Layer | Rubber Hardness of Elastic Layer | Solid Printing | Deformation of Image | Variation of Printing Pressure |
|---|---|---|---|---|---|
| 1 | 40 | 40 | good | slight deformation | relatively large |
| 2 | 50 | 40 | good | not | small |
| 3 | 60 | 40 | good | not | small |
| 4 | 70 | 40 | good | not | small |
| 5 | 80 | 40 | good | not | small |
| 6 | 90 | 40 | good | not | small |
| 7 | 98 | 40 | conspicuous transposition | not | small |
| 8 | 90 | 5 | bad collapse because of insufficient pressure | not | small |
| 9 | 90 | 10 | bad collapse because of insufficient pressure | not | small |
| 10 | 90 | 20 | good | not | small |
| 11 | 90 | 30 | good | not | small |
| 12 (= 6) | 90 | 40 | good | not | small |
| 13 | 90 | 50 | relatively bad collapse | not | small |
| 14 | 90 | 90 | bad collapse because of incapability of following up undulations of paper | not | large |

In Example 1 (comparison), doubling of the image area and deformation of the image were observed, and the sharpness of printed letters was degraded. In Example 14 (comparison), the printing plate could not follow up undulations of the paper sheet, and transposition was caused in the solid printed area. On the other hand, for instance, in Example 6, thickening of the image area or reduction of the sharpness was not caused, the collapse of the solid portion was good (solid printing was good) and a high quality print was obtained.

What is claimed is:
1. A printing plate comprising:
a printing plate member;

an easily deformable elastic layer laminated on said printing plate member, the thickness of said elastic layer being selected so that when a compression quantity of the plate during printing is 0.1 mm, a printing pressure is in the range of 0.5 to 20 kgf/cm$^2$;

a surface layer laminated on said elastic layer, said surface layer having a higher elasticity than that of said elastic layer; and a printing surface layer formed on said surface layer, said printing surface layer having an image area having affinity with ink and a non-image area having ink repellency.

2. A printing plate as set forth in claim 1, wherein the rubber hardness of said elastic layer is 10 to 50 and the rubber hardness of said surface layer is 50 to 90, wherein the rubber hardness is measured as specified in JIS K-6301.

3. A printing plate as set forth in claim 2, wherein the difference of the rubber hardness between the elastic layer and the surface layer is at least 10.

4. A printing process comprising:
providing a printing plate comprising:
- (i) a printing plate member;
- (ii) an easily deformable elastic layer laminated on said printing plate member, the thickness of said elastic layer being selected so that when a compression quantity of the plate during printing is 0.1 mm, a printing pressure is in the range of 0.5 to 20 kgf/cm$^2$;
- (iii) a surface layer laminated on said elastic layer, said surface layer having a higher elasticity than that of said elastic layer; and
- (iv) a printing surface layer formed on said surface layer, said printing surface layer having an image area having affinity with ink and a non-image area having ink repellency; and supplying ink to said printing plate by using 0 to 4 ink transfer rollers.

5. A printing process comprising:
providing a printing plate comprising:
- (i) a printing plate member;
- (ii) an easily deformable elastic layer laminated on said printing plate member, the thickness of said elastic layer being selected so that when a compression quantity of the plate during printing is 0.1 mm, a printing pressure is in the range of 0.5 to 20 kgf/cm$^2$;
- (iii) a surface layer laminated on said elastic layer, said surface layer having a higher elasticity than that of said elastic layer; and
- (iv) a printing surface layer formed on said surface layer, said printing surface layer having an image area having affinity with ink and a non-image area having ink repellency; and directly printing a material to be printed by using said printing plate.

* * * * *